(12) United States Patent
Mack

(10) Patent No.: US 7,131,075 B2
(45) Date of Patent: Oct. 31, 2006

(54) SEMICONDUCTOR DEVICE HAVING INTRINSIC PRECISION PROPERTIES

(75) Inventor: Paul Mack, 25 Shipley Crescent, Stittsville (CA) K2S 1R2

(73) Assignee: Paul Mack, Stittsville (CA)

( * ) Notice: Subject to any disclaimer, the term of this patent is extended or adjusted under 35 U.S.C. 154(b) by 87 days.

(21) Appl. No.: 10/704,586

(22) Filed: Nov. 12, 2003

(65) Prior Publication Data

US 2005/0098848 A1    May 12, 2005

(51) Int. Cl.
    *G06F 17/50*    (2006.01)
(52) U.S. Cl. ............................................. 716/1; 716/10
(58) Field of Classification Search .................... 716/1, 716/2, 8–10; 703/2, 13–14; 257/499, 528, 257/531–533, 536, 595
See application file for complete search history.

(56) References Cited

U.S. PATENT DOCUMENTS

| | | | |
|---|---|---|---|
| 6,129,459 A * | 10/2000 | Kishimoto et al. | 703/5 |
| 6,347,393 B1 * | 2/2002 | Alpert et al. | 716/2 |
| 6,519,748 B1 * | 2/2003 | Sakamoto | 716/6 |
| 6,583,495 B1 * | 6/2003 | Lee et al. | 257/595 |
| 6,732,065 B1 * | 5/2004 | Muddu | 703/2 |
| 6,880,134 B1 * | 4/2005 | Drennan | 716/2 |

* cited by examiner

Primary Examiner—Vuthe Siek

(57) ABSTRACT

A semiconductor device has a circuit element having a given value of a characteristic property. The circuit element has at least two individual elements, each having an individual value for the characteristic value thereof, the individual values including an error portion that is substantially statistically uncorrelated, the individual elements disposed solely for contributing to the values of the characteristic property.

20 Claims, 4 Drawing Sheets

US 7,131,075 B2

1

SEMICONDUCTOR DEVICE HAVING INTRINSIC PRECISION PROPERTIES

FIELD OF THE INVENTION

The instant invention relates to semiconductor devices having enhanced intrinsic precision properties that allow establishing a characteristic length in the sub-µm region.

BACKGROUND OF THE INVENTION

One of the major goals in modern telecommunication is to achieve ever increasing transmission rates as well as data broadcast speeds, which is intimately coupled with the need of new and advanced technologies providing the necessary tools for accomplishing this quest. The demand for high precision in manufacturing semiconductor devices calls for the development of new manufacture tools and technologies, which is accompanied with a considerable amount of financial efforts. Thus, it would be advantageous to have at hand simple concepts which allow for the production of semiconductor devices with a characteristic length well below the µm region, but which do not require additional operating expenses.

SUMMARY OF THE INVENTION

In accordance with the invention there is provided a circuit element of a semiconductor device. The circuit element has an electrical property value and is formed by at least two individual elements, each of the individual elements has an electrical property value including an error portion that is substantially statistically uncorrelated with regard to the other individual elements wherein the electrical property value of the circuit element is a function of a summation of the electrical property values of the individual elements.

In accordance with another aspect the invention there is provided a method of providing a design of a semiconductor device. The method comprising the steps of providing a design of a circuit for inclusion within the semiconductor device, the circuit including at least one circuit element having an electrical property value, forming the circuit element from a concatenation of a plurality of individual elements each having an electrical property value, the electrical property value of the circuit element being a concatenation of the electrical property values of the individual elements, and providing an electronic design including the circuit element and having the individual elements arranged such that any errors resulting from the manufacturing thereof are substantially uncorrelated one with another.

In accordance with another aspect the invention there is provided a storage medium having instruction data stored therein for when executing by a processor resulting in performance of: providing a design of a circuit for inclusion within the semiconductor device, the circuit including at least one circuit element having an electrical property value, forming the circuit element from a concatenation of a plurality of individual elements each having an electrical property value, the electrical property value of the circuit element being a concatenation of the electrical property values of the individual elements, and providing an electronic design including the circuit element and having the individual elements arranged such that any errors resulting from the manufacturing thereof being substantially other than correlated one with another.

2

BRIEF DESCRIPTION OF THE DRAWINGS

The instant invention is now described in detail in conjunction with the following drawings, in which.

DETAILED DESCRIPTION OF THE INVENTION

Figure 1:
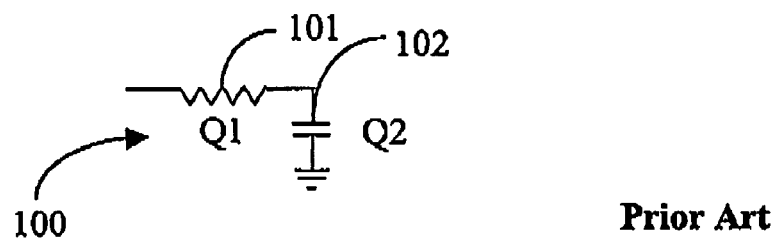
FIG. 1 shows part of a prior art conventional semiconductor device.

In FIG. 1, a schematic partial diagram of a prior art semiconductor device 100 is shown. The semiconductor devices is manufactured in the usual way, and comprises different layers of different materials, into which by means of deposition, masking, etching, and/or other production techniques various elements are integrated. The semiconductor device comprises a variety of different elements, such as resistors, capacitors, transistors, diodes, and the like, two of which are schematically displayed in FIG. 1. Theses elements are designated as $Q_1$ and $Q_2$, and referred to as 101 and 102. An element $Q_n$ in the form of a resistor possesses characteristic dimensions, which are, for the resistor, characteristic length $L_n$, characteristic width $W_n$, and characteristic height $H_n$. The characteristic length $L_n$ of the element extends in a direction substantially parallel to the current flow through the element $Q_n$, and direction of characteristic width $W_n$ together with the direction of characteristic length $L_n$ define a set of vectors that span a two-dimensional plane perpendicular to the direction of current flow within the element $Q_n$, of the semiconductor device 100.

Each element possesses a characteristic property such as resistance, capacitance, inductance, and so forth. The characteristic property of element $Q_n$ is in the following designated as $\Theta_n$. For a semiconductor device, $\Theta_n$ typically is a function of the characteristic length $L_n$ of element $Q_n$, equation (1):

$$\Theta_n = f(L_n) \quad (1)$$

Associated with each characteristic property $\Theta_n$ is associated a certain error $\Delta\Theta_n$, defining the accuracy of element $Q_n$. Similar to equation (1), the error $\Delta\Theta_n$ is expressed as a function of fabrication precision $\Delta L_n$, equation (2):

$$\Delta\Theta_n = f(\Delta L_n) \quad (2)$$

In order to achieve a certain performance precision, allowing for an increase in speed and for a dimension reduction into the sub-µm region, an enhanced precision, that is a smaller $\Delta L_n$, is desirable. That in many cases calls for enhanced manufacturing techniques, allowing for more precise production of semiconductor devices.

Figure 2:
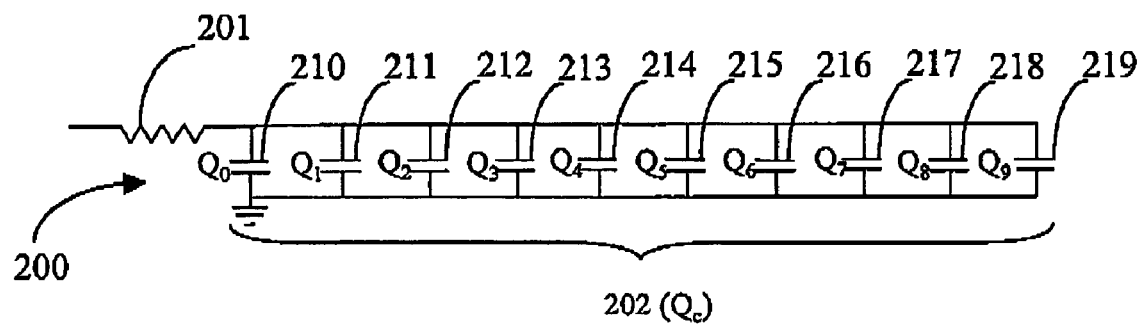
FIG. 2 shows an embodiment of part of a semiconductor device.

Referring now to FIG. 2, shown is a schematic diagram of a semiconductor device 200 including an RC circuit according to the instant invention. The semiconductor device according to the instant invention is manufactured using known technologies and in similar fashion as described above. The semiconductor device comprises a resistor 201 and a concatenated element $Q_0$ forming a capacitance of the RC circuit. A concatenated element $Q_0$ 202 comprises ten individual elements $Q_0$ 210 to $Q_9$ 219, respectively. Referring to FIG. 2, these elements are connected in parallel. Other arrangements are easily envisioned, in which for example the elements $Q_0$ 210 to $Q_9$ 219 are connected in series.

The principle of the instant invention is now illustrated for a capacitor with capacitance C comprising ten individual capacitors with capacitances $C_0$ to $C_9$, respectively, the ten individual capacitors connected in parallel. A person of skill in the art with ease extends this example to other representative elements as well.

The capacitance C of a capacitor on a semiconductor device is basically expressed by equation (3):

$$C = \varepsilon_0 \cdot \varepsilon_r \cdot \frac{W}{H} \cdot L \tag{3}$$

In equation (3), $\varepsilon_0$ is the dielectric constant in vacuo, and $\varepsilon_r$ a material dependent dielectric constant of the semiconductor device. Assuming that the ten individual capacitors have constant height and constant width, and combining the constant values of W, H, $\varepsilon_0$ and $\varepsilon_r$ into a new constant $\kappa$, one obtains:

$$C = \kappa \cdot L \tag{4}$$

Since the ten individual capacitors are connected in parallel, one obtains the following relation between capacitance and individual lengths:

$$C = \sum_{n=0}^{9} C_n = \kappa \cdot \sum_{n=0}^{9} L_n \tag{5}$$

Equation (5) in view of equation (3) suggests that the precision in capacitance C is directly related to the accuracy with which the individual capacitors are manufactured. If the ten individual capacitors are manufactured in a statistically correlated fashion, that is if they are manufactured within the same process, the precision in capacitance $\Delta C$ is a sum of the absolute values of fabrication precision:

$$\Delta C = \sum_{n=0}^{9} |\Delta L_n| = 10\delta \tag{6}$$

In equation 6, $\delta$ represents an absolute value of a fabrication precision $\Delta L_n$. In case that the ten individual capacitors are not manufactured with a same process, their individual errors are truly uncorrelated, and one obtains:

$$\Delta C = \sum_{n=0}^{9} \pm \Delta L_n \tag{7}$$

According to the instant invention, the semiconductor device is manufactured in a way that the individual elements constituting a given element $Q_n$ are manufactured independently, and are therefore not statistically correlated. Thus, the fabrication precision $\Delta L_n$ is different for all individual elements, possibly not only in magnitude, but also in sign. This allows for error cancellation resulting in a concatenated element $Q_c$ with a higher precision in its characteristic property than a single element Q having essentially the same value for $\Theta$.

Statistical correlation is avoidable through numerous methods. One of skill in the art will appreciate that differing levels of statistical decorrelation result in improved or reduced benefit of the inventive method disclosed herein.

Figure 3:
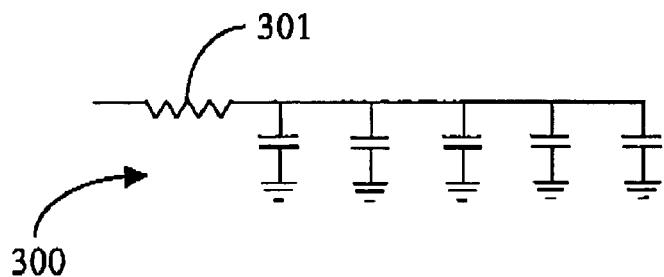
FIG. 3 shows an embodiment of part of a semiconductor device.

Referring to FIG. 3, a portion of a schematic for a semiconductor device 300 according to the invention is shown wherein the individual elements constituting a given element $Q_n$ are specified distinctly and are therefore not statistically correlated. Here, each individual element has a different characteristic value differing from the others by an amount selected to be statistically distinct. For example, as shown, by selecting lengths of the capacitive elements that vary in small amounts but result in capacitances that sum to the overall desired capacitance, a further correlation between individual elements is eliminated. For example, when the capacitances are 10.02, 9.83, 10.08, 10.11, 9.96, the error within each capacitance value is substantially uncorrelated as the errors relating to process vary due to the small variations in individual capacitor sizes. If the capacitive elements are also manufactured according to a different process—disposed on different layers or manufactured differently—then two types of decorrelation between individual errors result. Increasing the types of decorrelation acts to increase the convolution of error functions resulting in a larger proportion of errors being grouped about the desired value and fewer errors being distant therefrom (convolution of two peaks results in a sharper peak as shown in FIG. 3*b*).

Figure 3B:
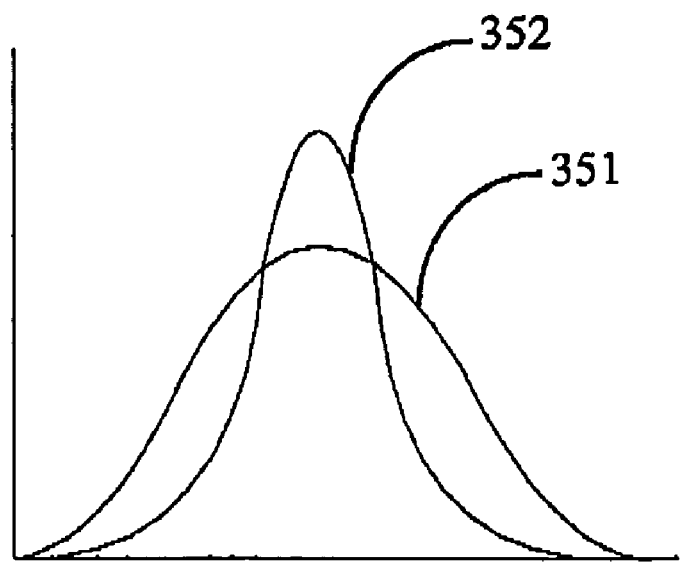
FIG. 3b shows a simplified graphical diagram of error distribution within a manufacturing process.

Referring to FIG. 3*b*, a graph is shown having two curves. The curve 351 is a statistical distribution of random error for manufacturing of a single element. When two elements forming a concatenated element are manufactured with statistically uncorrelated processes, the resulting error distribution has a sharper peak thereby reducing the number of resulting concatenated elements falling outside a given accuracy. Though this is the case, the maximum error value resulting from the manufacturing process remains unchanged. Greater number of elements forming the concatenated element and each formed such that the error in the manufacture thereof is uncorrelated with the error within the manufacture of the other elements results in an even sharper peak and therefore in a tighter grouping of the concatenated element about a designated value.

As the level of correlation between individual elements is reduced, the portion of the manufacturing error that is able to cancel with other errors becomes increased for the set of individual elements. Thus, the level or percentage of repeatability in manufacture is enhanced through the present process. The present method allows for a tighter grouping of errors about a near zero error value therefore increasing yield or, for high precision components, manufacturability.

Here, the capacitance of the individual elements instead of being the total capacitance divided by the number of individual elements is (the total capacitance divided by the number of individual elements) offset by a small but significant amount. Of course, statistics are used to determine significance. As such, when applied to the schematic in the example of FIG. 2, each individual capacitor is slightly different but the sum of all the capacitors is the capacitance C.

Figure 4:
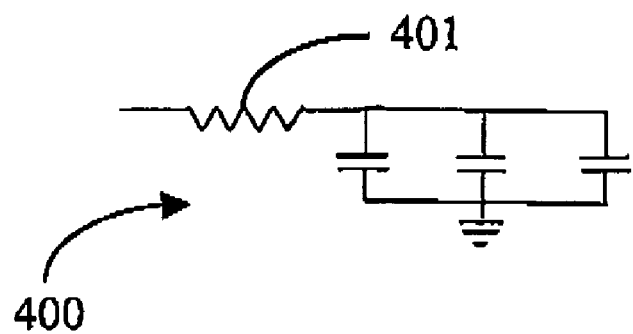
FIG. 4 shows an embodiment of part of a semiconductor device.

Referring to FIG. 4, a semiconductor device according to the invention is shown wherein the individual elements constituting a given element $Q_n$ are specified distinctly and formed within different manufacturing steps. Here, each individual element has a different characteristic value differing from the others by an amount selected to be statistically distinct, for example 10.00, 11.12, and 8.88, and each individual element is disposed on a different layer or formed by a separate process, for example, using different dielectrics. As such, the level of correlation between individual elements is reduced both in dimension and in manufacturing resulting in the portion of the manufacturing error that is uncorrelated becoming increased for the set of individual elements. Conversely, correlated errors typically sum similarly for each additional element. Thus, when error is highly correlated, the resulting peak is similar regardless of the number of elements.

Figure 5:
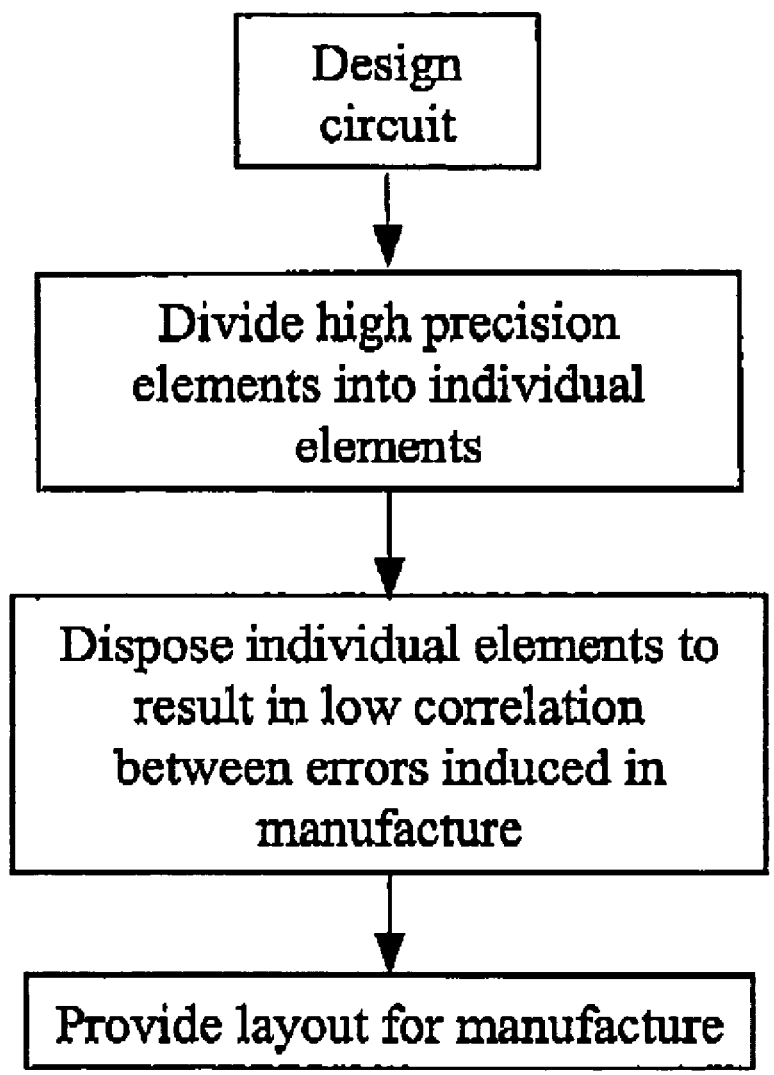
FIG. 5 shows a simplified flow diagram of a method according to the present invention.

Referring to FIG. 5, a flow diagram of a method according to the invention is shown. A circuit is designed and provided for layout. In the layout process, circuit elements requiring high precision are identified and are then divided into a plurality of individual elements, the plurality of individual elements having a same characteristic as the identified circuit element requiring high precision. The individual elements are disposed within the layout in a manner to provide for a statistical decorrelation between manufacturing errors anticipated to occur for each individual element. Preferably, the statistical decorrelation is sufficient to improve the efficiency to or above the required high precision. The layout is then provided for manufacture and, during manufacture testing is performed to ensure that the increase in parts meeting or exceeding the required high precision is achieved.

It is well known to those of skill in the art that the method of FIG. 5 is implementable manually or by an automated software process. Further, the process is implementable during design by the designer or by the software tools used during design. Of course, implementing of the method during design in an automated fashion allows for simulation of the design as implemented providing increased testing abilities.

Decorrelation between errors induced in manufacture of individual elements is determinable through experimentation or through reasonable prediction. For example, elements formed by distinct processes, formed on different layers or with different masks, formed of different compositions, having distinct values, etc. typically result in smaller correlation between manufacturing errors therebetween. Of course, this may not always be the case.

Figure 6:
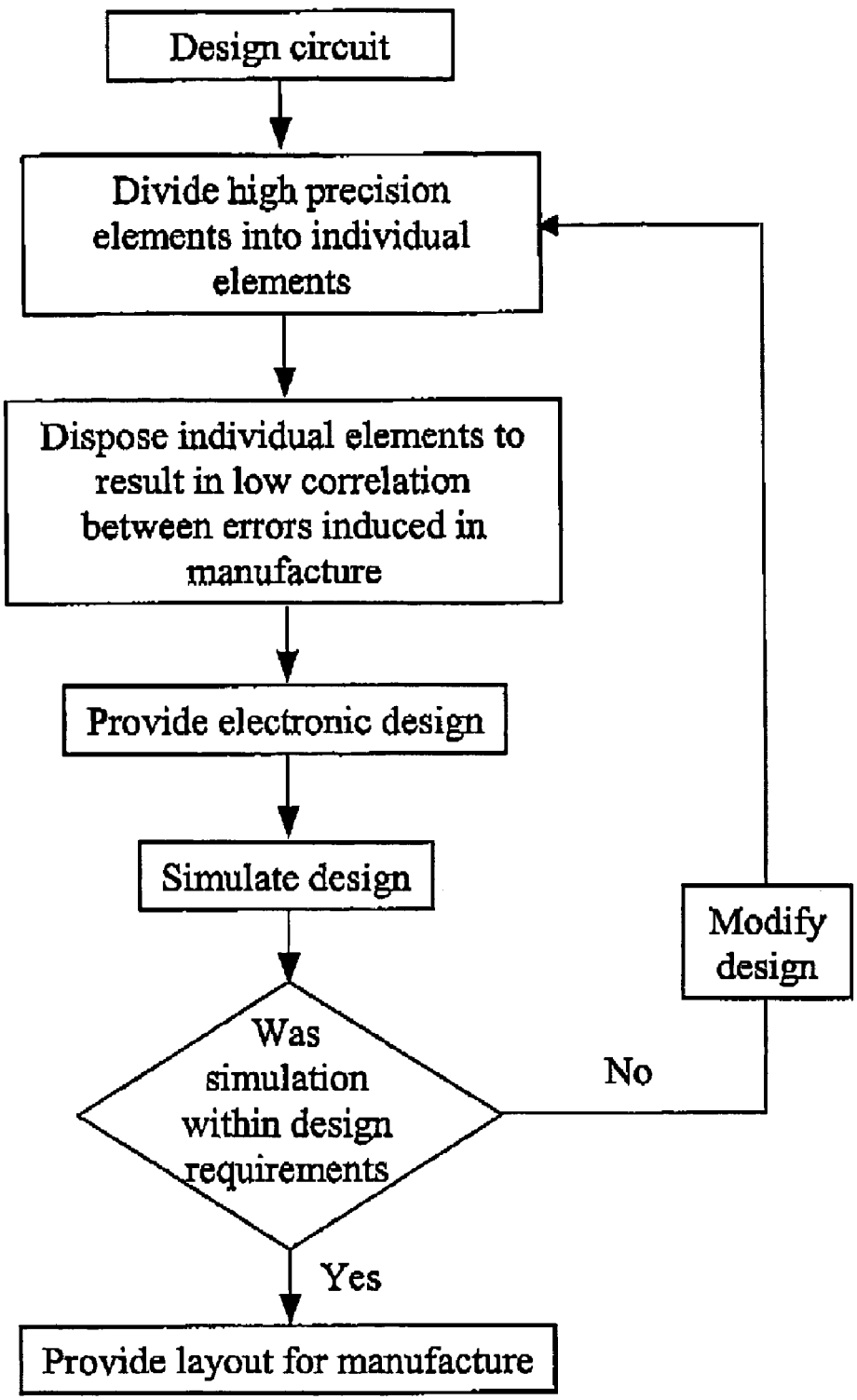
FIG. 6 shows a simplified flow diagram of a method according to the present invention.

Referring to FIG. 6, a flow diagram of a method according to the invention is shown. A circuit is designed and provided for layout. In the layout process, circuit elements requiring high precision are identified and are then divided into a plurality of individual elements, the plurality of individual elements having a same characteristic as the identified circuit element requiring high precision. The individual elements are disposed within the layout in a manner to provide for a statistical decorrelation between manufacturing errors anticipated to occur for each individual element. Preferably, the statistical decorrelation is sufficient to improve the efficiency to or above the required high precision. The layout is then provided for simulation. Upon completion of the simulation, the design is modified as necessary and then the process is iterated until the design requirements are met. The layout is then provided for manufacture and, during manufacture testing is performed to ensure that the increase in parts meeting or exceeding the required high precision is achieved.

Although the present invention has been described with respect to specific embodiments thereof, various changes and modifications are optionally carried out by those skilled in the art without departing from the scope of the invention. Therefore, it is intended that the present invention encompass such changes and modifications as fall within the scope of the appended claims.

What is claimed is:

1. A circuit element of a semiconductor device, the circuit element having an electrical property value and being formed by at least two individual elements, each of the individual elements having an electrical property value including an error portion that is substantially statistically uncorrelated with regard to the other individual elements wherein the electrical property value of the circuit element is a function of a summation of the electrical property values of the individual elements, wherein there is a difference in the electrical property value of the at least two individual elements of less than 10 percent.

2. The circuit element according to claim 1, wherein the circuit element is a member of the group consisting of resistors, capacitors and inductors.

3. The circuit element according to claim 1 wherein there are more than 5 individual elements forming the circuit element.

4. The circuit element according to claim 1 wherein at least one of the individual elements forming the circuit element is formed with a different manufacturing process.

5. The circuit element according to claim 4 wherein at least one of the individual elements forming the circuit element includes a different material.

6. The circuit element according to claim 1 wherein at least one of the individual elements forming the circuit element is doped differently.

7. The circuit element according to claim 1 wherein at least one of the individual elements forming the circuit element is formed with a same manufacturing process in a fashion that the manufacturing errors are uncorrelated therebetween.

8. The circuit element according to claim 7 wherein at least one of the individual elements forming the circuit element is doped differently.

9. The circuit element according to claim 7 wherein at least one of the individual elements forming the circuit element is disposed within a different layer of the semiconductor device.

10. The circuit element according to claim 1 wherein a substantial portion of any manufacturing errors associated with the formation of the individual elements is substantially uncorrelated in more than one dimension.

11. The circuit element according to claim 10 wherein a substantial portion of any manufacturing errors associated with the formation of the individual elements is substantially uncorrelated in more than two dimensions.

12. A method of manufacturing a semiconductor device designed according to a method of providing a design comprising the steps of:
   providing a design of a circuit for inclusion within the semiconductor device, the circuit including at least one circuit element having an electrical property value;
   forming the circuit element from a concatenation of a plurality of individual elements each having an electrical property value, the electrical property of the circuit element being a concatenation of the electrical property values of the individual elements; and
   providing en electronic design including the circuit element and having the individual elements arranged such that any error resulting from the manufacturing thereof are substantially uncorrelated one with another, wherein a difference between the electrical property value of the individual elements is less than 10 percent.

13. The method according to claim 12 further comprising the steps of:

i) simulating the electronic design; and
ii) amending one of the electronic design and design of a circuit, wherein the steps (i) and (ii) are iterated until the simulated electronic design meets predetermined design criteria.

14. The method according to claim 12 wherein there are more than 5 individual elements.

15. The method according to claim 12 wherein at least one of the individual elements forming the circuit element are formed with different manufacturing processes.

16. The method according to claim 12 wherein at least one of the individual elements forming the circuit element is doped differently.

17. The method according to claim 12 wherein at least one of the individual elements forming the circuit element is formed using a manufacturing process in a fashion that the manufacturing errors are uncorrelated therebetween.

18. The method according to claim 12 wherein at least one of the individual elements forming the circuit element is disposed within different layers of the semiconductor device.

19. The method according to claim 12 wherein a substantial portion of any manufacturing errors associated with the individual elements forming the circuit element are substantially uncorrelated in more than one dimension.

20. The method according to claim 19 wherein a substantial portion of the manufacturing errors associated with the individual elements forming the circuit element are substantially uncorrelated in more than two dimensions.

* * * * *